United States Patent [19]

Gabaldon

[11] Patent Number: 4,817,848
[45] Date of Patent: Apr. 4, 1989

[54] COMPLIANT MOTION SERVO

[75] Inventor: John B. Gabaldon, San Diego, Calif.

[73] Assignee: Hughes Aircraft Company, Los Angeles, Calif.

[21] Appl. No.: 193,450

[22] Filed: May 12, 1988

[51] Int. Cl.⁴ .............................................. B23K 20/10
[52] U.S. Cl. .................................... 228/102; 228/105;
228/1.1; 228/4.5; 228/9; 219/85.18; 219/56.21; 219/56.22
[58] Field of Search ................................ 228/102–105, 228/110, 1.1, 4.5, 9; 219/85 F, 56.21, 56.22

[56] References Cited

U.S. PATENT DOCUMENTS

| | | | |
|---|---|---|---|
| 4,444,349 | 4/1984 | Bilane et al. | 228/102 |
| 4,571,688 | 2/1986 | Kashihara et al. | 228/102 |
| 4,597,519 | 7/1986 | Kurtz et al. | 228/102 |
| 4,598,853 | 7/1986 | Hill | 228/4.5 |
| 4,603,802 | 8/1986 | Kurtz et al. | 228/102 |
| 4,718,591 | 1/1988 | Hill | 228/4.5 |

Primary Examiner—Nicholas P. Godici
Assistant Examiner—Samuel M. Heinrich
Attorney, Agent, or Firm—Joseph E. Szabo; Anthony W. Karambelas

[57] ABSTRACT

An automatic ultrasonic wire bonder employs a compliant motion servo (17, 119, 239, 200) on its Z axis drive to maintain a known, constant and steady force applied by the bonding tool (13) to the wire. The tool is resiliently mounted to a carriage (15) that is driven by a force control servo (17, 119, 238, 200). During bonding, the tool is pressed against the wire, and effects of variations in tool tip Z axis position caused by vibration, wire deformation during bonding and other factors of the equipment are minimized by a servo that precisely controls and maintains a fixed position of the carriage relative to the wire to thereby maintain a preselected force between the bonding tool tip and the wire.

14 Claims, 5 Drawing Sheets

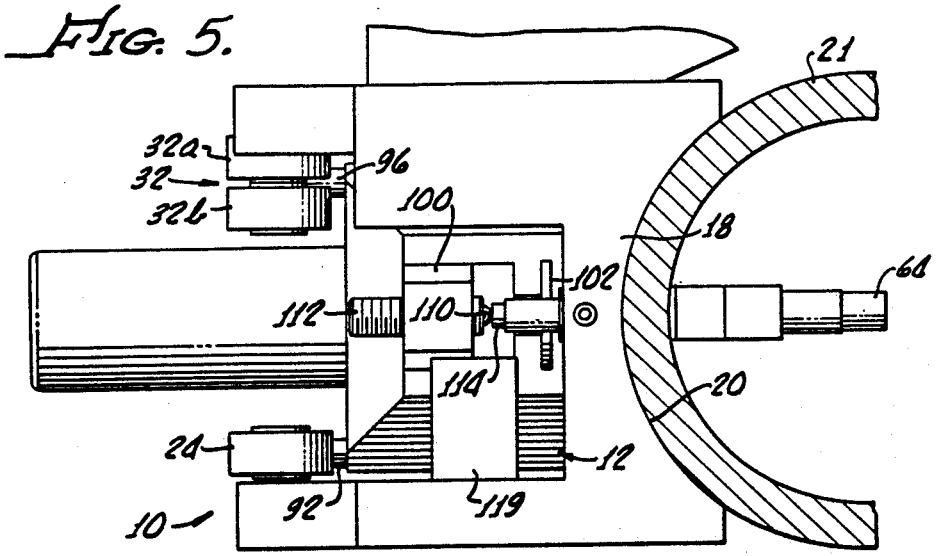
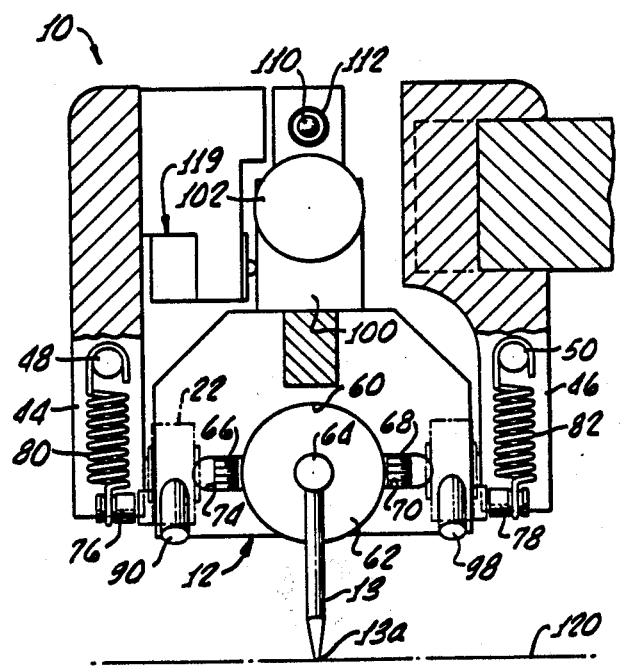

COMPLIANT MOTION SERVO

BACKGROUND OF THE INVENTION

1. Field of the Invention

The present invention relates to controlled application of a force, and in a specific arrangement concerns an ultrasonic wire bonder in which there is minimized variation of pressure applied by the bonding tool tip to the object being bonded.

2. Description of Related Art

In manipulation of objects and performance of different types of processes, contact between a tool or object handler and an object being handled or worked upon, is often preferred to exert a known and controllable force upon the object. For example, in an ultrasonic wire bonding machine a slender, elongated tool is ultrasonically vibrated and moved against a wire to be bonded with a predetermined pressure while the tool tip is vibrated, in a direction parallel to the wire end under the tool tip, to create a bond between the wire and a bonding pad upon which the wire is placed. Characteristics of the bond are determined by a number of parameters of the bonding operation. One of such parameters is the amount of pressure or force applied by the bonding tool against the wire to press the wire against the bonding pad during application of ultrasonic bonding energy. If such bonding pressure should vary from one bond to another, or if it should vary during the performance of a single bonding operation, the resulting bond may be less desirable and less reliable, and has a greater probability of failure.

In performing an ultrasonic wire bonding operation, the tool tip is moved relative to the workpiece to a point over the area to be bonded, a length of wire is fed along the vertical tool to position an end of the wire beneath the tool tip. The tool tip often has a groove to locate and orient the wire. The tool and wire, which is in the tip groove, are then moved vertically downwardly until the wire contacts the workpiece or bonding pad to which it is to be bonded and is pressed against the pad by pressure of the bonding tool. The tool is then ultrasonically energized to form the bond while pressure continues to be applied to the wire by the tool. Having completed a bond, the tool is raised vertically and then moved to an area for making a subsequent bond. Great care must be taken in controlling the nature of the initial contact of wire and bond pad and the magnitude of force applied during application of ultrasonic energy.

In the past, force applied by the bonding tool has been controlled by a compliant mounting of the tool to the bonding carriage. U.S. Pat. No. 4,598,853 of William H. Hill for Open Center Flexural Pivot Wire Bonding Head, which is assigned to the assignee of the present application, describes a flexural pivot structure that pivotally mounts the bonding tool to its carriage upon a pair of leaf springs. The spring mount permits a relatively large amount of vertical motion with a minimized tip skid. Tip skid is the term used to describe the small amount of horizontal motion that takes place upon initial contact of the effectively pivotally mounted bonding tool. The springs help to provide the desired amount of vertical or Z axis preloading, e.g. the desired pressure of tool tip against wire during application of ultrasonic energy.

Another type of open center spring loaded pivot mounting for a wire bonding tool is described in U.S. Pat. No. 4,718,591 of William H. Hill, for a Wire Bonder With Open Center of Motion, which is assigned to the assignee of the present application. In U.S. Pat. No. 4,718,591 of Hill, as in his U.S. Pat. No. 4,598,853, magnitude of a force applied by the bonding tool to the wire during the ultrasonic bonding is determined by the springs which resist the pivotal deflection of the tool after it initially contacts the workpiece. The vertically movable tool carriage is provided with a small amount of over travel (travel beyond the point of initial touchdown of the tool tip) to provide a selected amount of preloading. Thus in the prior operations, the tool tip pressure is determined by the deflection of the springs which mount the tool to the bonding carriage and also by the carriage position. Amount of spring deflection is in turn determined by the amount of over travel. However, application of a constant force by the described arrangements may be hindered by one or more of the following factors: mechanical vibrations in the equipment, occurrence of wire deformation during application of ultrasonic energy, variability in the Z axis (vertical) position of the top of the bonding pad, and, in addition, touch sensitivity of the bonding tool. All of these factors tend to move the tool vertically to change spring deflection during application of ultrasonic energy.

Touch sensitivity is the ability of the tool mechanics and logic to determine the precise point of touchdown (the point from which amount of over travel is measured). Touchdown is generally signaled by a pair of switch contacts which are separated at the occurrence of touchdown. Precision of the point of signaling is adversely affected by variation in the relative motion of the contact elements, the finite incremental angular accuracy of the motor position encoder, and the time required for system logic circuits to sense and signal this occurrence. Bonding pads may be of different thicknesses, or may be secured to the substrate with different amounts of adhesive, and thus the height of the pad top surface above the substrate may vary.

During the bonding operation the wire, which is initially of circular cross section, is deformed under pressure to a considerably flatter cross section and thus elevation of the bonding tool will change during the actual bonding operation.

Still further, mechanical vibration of the equipment, generally in the order of ten to fifteen cycles per second, will cause variation in magnitude of force applied during the bonding operation. Particularly in an automatic bonding operation, where it is desired to perform bonding operations rapidly, the equipment is moved from one position to another at high speed and stopped at the desired position to perform the bonding operation. Because of the desire for high speed operation, the equipment may not be completely in its static condition for a time sufficient to allow vibrations occurring during the dynamic motion to subside before initiation of the bonding. Accordingly, such vibrations may still exist during at least a portion of the bonding operation.

All of these factors, touch sensitivity of the tool, wire deformation, bonding pad placement height and mechanical vibration, individually and/or collectively contribute to variation in the magnitude of a desired force to be applied by the bonding tool, and thus tend to result in bonds that are of less than optimum reliability.

Accordingly, it is an object of the present invention to provide a method and apparatus for applying force to an object while avoiding or minimizing above-mentioned problems.

SUMMARY OF THE INVENTION

In carrying out principles of the present invention, in accordance with a preferred embodiment thereof, a pressure applying tool is movably mounted to a carriage, and its motion relative to the carriage is resisted. To maintain a constant force between the tool and a workpiece, drive means for the carriage, which drives the carriage toward and away from the workpiece, is driven by an error signal produced by comparing a commanded force signal and a feedback signal that is indicative of position of the tool relative to the carriage. The carriage is driven so as to drive the error signal toward zero. According to one feature of the invention, a first or positioning servo is employed to drive the carriage to a search height which positions the tool tip closely adjacent to the surface of the bonding pad or surface of an object to be contacted. Then this positioning servo is disabled and a second servo, a force servo, is employed to further move the carriage and to maintain the carriage at a position in which force is applied by the tool tip to the contact surface of the workpiece and such force has a predetermined and relatively constant value. The force servo includes sensor means for producing a feedback signal and error means for generating a force error signal that represents the difference between a commanded force and a sensed position of the bonding tool relative to the carriage. The force servo actually causes the carriage to follow motions of the workpiece and therefore to remain in a position that is fixed relative to the workpiece contact surface as the latter moves in response to vibration in or deformation of the wire. In effect the force servo drives the carriage one way or the other so as to maintain a predetermined position of the bonding tool relative to the carriage, thereby to maintain a predetermined amount of deflection of the springs which resist motion of the bonding tool relative to the carriage. As spring force is directly proportional to spring displacement (deflection), fixed spring displacement yields fixed spring force.

BRIEF DESCRIPTION OF THE DRAWINGS

In the accompanying drawings:

FIG. 3 is a cross section taken on lines 2—2 of FIG. 2 with parts broken away and parts shown in elevation;

FIG. 5 is a plan view of parts of the top of the machine of FIG. 2;

DESCRIPTION OF A PREFERRED EMBODIMENT

Figure 6:
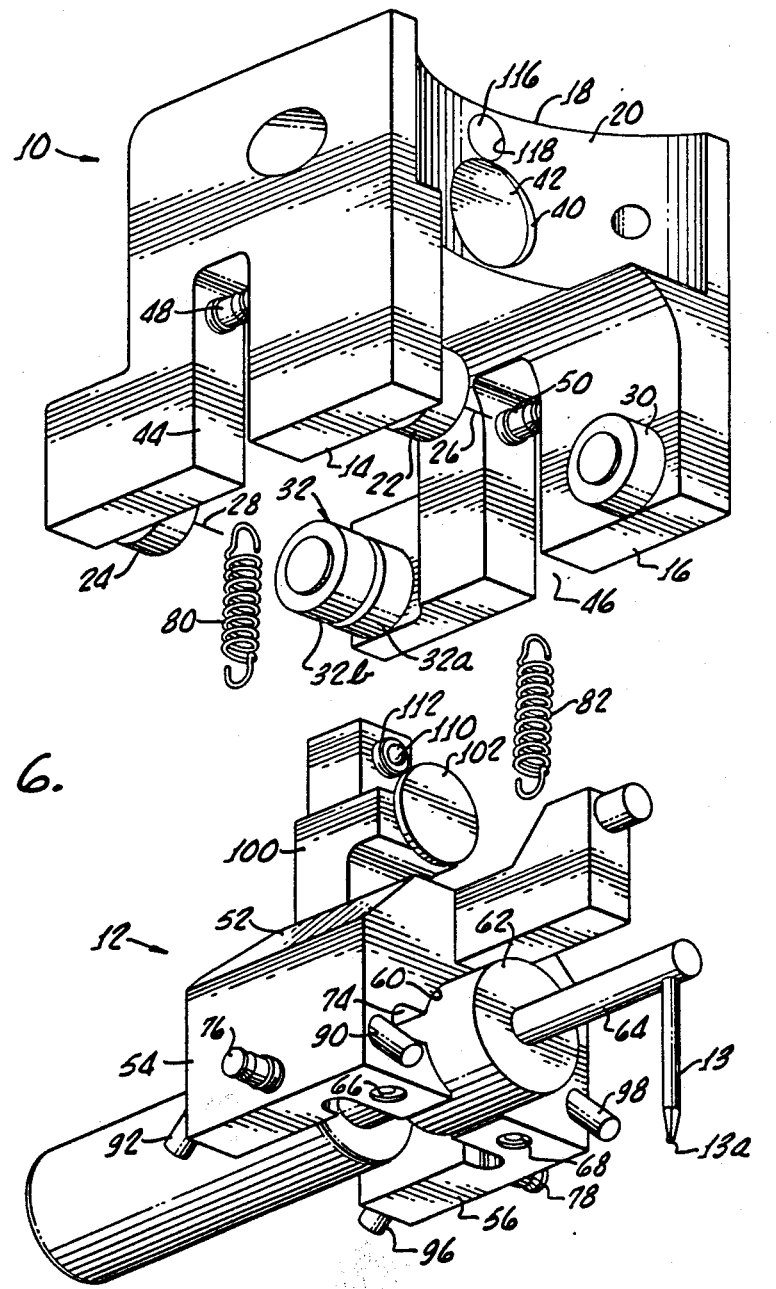
FIG. 6 is an exploded perspective view of the bonder frame and transducer support.

An ultrasonic wire bonding machine embodying principles of the present invention incorporates a bonding frame 10 to which is movably mounted, by an open center mounting means, a transducer support 12 which carries a bonding tool 13. Open center flexural mounting for bonders are shown in U.S. Pat. Nos. 4,598,853 and 4,718,591 of William Hill. The bonding machine shown herein is the same as that disclosed in U.S. Pat. No. 4,718,591. The bonding frame of U.S. Pat. No. 4,718,591 is formed of a rigid body having a substantially inverted U-shape, including mutually spaced parallel side legs 14,16 and a bight or connecting portion 18 (FIG. 6). The bight 18 is formed with an arcuate forward facing surface 20 curved about a vertical axis and adapted to be bolted to a bonding head support 21 (FIGS. 1 and 5) which is connected to a bonder motion control apparatus similar to that shown in U.S. Pat. No. 4,718,591. The motion control apparatus enables the entire bonder head, including frame 10 and transducer support 12, to be moved vertically and rotatably about the vertical axis of arcuate surface 20. The vertical motion is controlled by a pair of servos illustrated in FIG. 7 and described below. This servo-controlled vertical motion is a major feature of the present invention.

Figure 1:
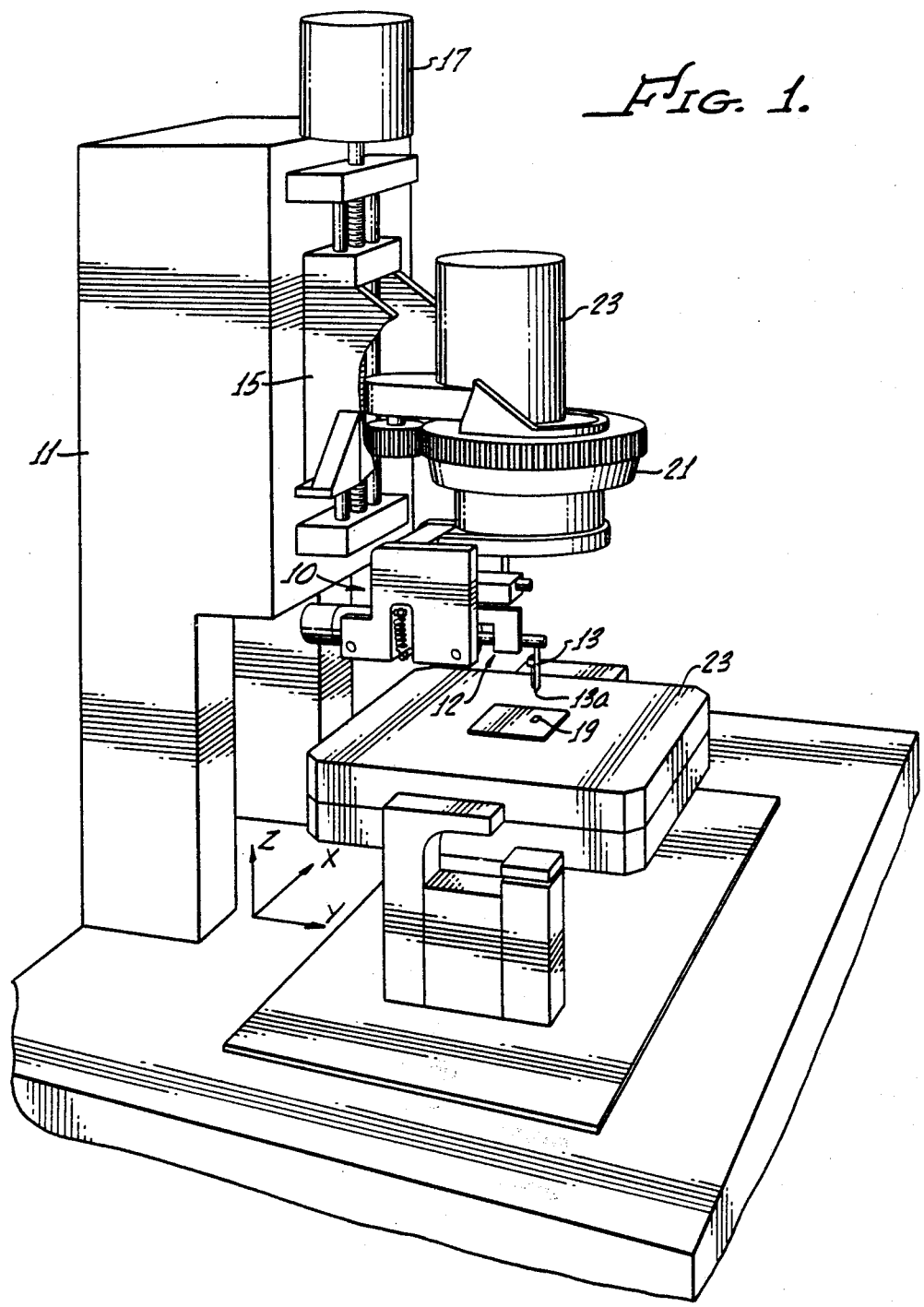
FIG. 1 is a pictorial view of an ultrasonic bonding machine embodying principles of the present invention.

As shown in FIG. 1, the motion control apparatus includes a fixed support 11 carrying a vertically movable carriage 15. The bonding head support 21 is rotatably mounted to the carriage for rotation about the axis of tool 13 and is rotated about such axis by a bi-directional rotation motor 23 carried on the carriage. A bi-directional vertical drive motor 17 carried on the fixed support 11 drives the bonding frame 10 upwardly and downwardly to precisely controllable vertical (Z axis) positions so as to position the tip 13a of tool 13 at controlled positions with respect to a semiconductor device, die or integrated circuit chip 19 mounted on a worktable 23 that is moved horizontally (along X and Y axes) by motor drives (not shown). Precision control of vertical motion is accomplished by two independent servo loops driving motor 17 as will be more particularly described below.

COMPLIANT TOOL MOUNTING

Rotatably mounted to inner surfaces of the side leg 14 are first and second ball-bearing rollers 22,24 journaled to the side leg about mutually spaced fixed transverse axes 26,28 (FIG. 4) which extend substantially horizontally and normal to the longitudinal or fore-and-aft axis of frame 10. Similarly, a second pair of ball-bearing rollers 30,32 is journaled to the side leg 16 at the inner side thereof on the same axes 26 and 28 respectively. Roller 32 is a double roller having mutually aligned rollers 32a, 32b that are slightly spaced axially from one another.

Figures 2, 4:
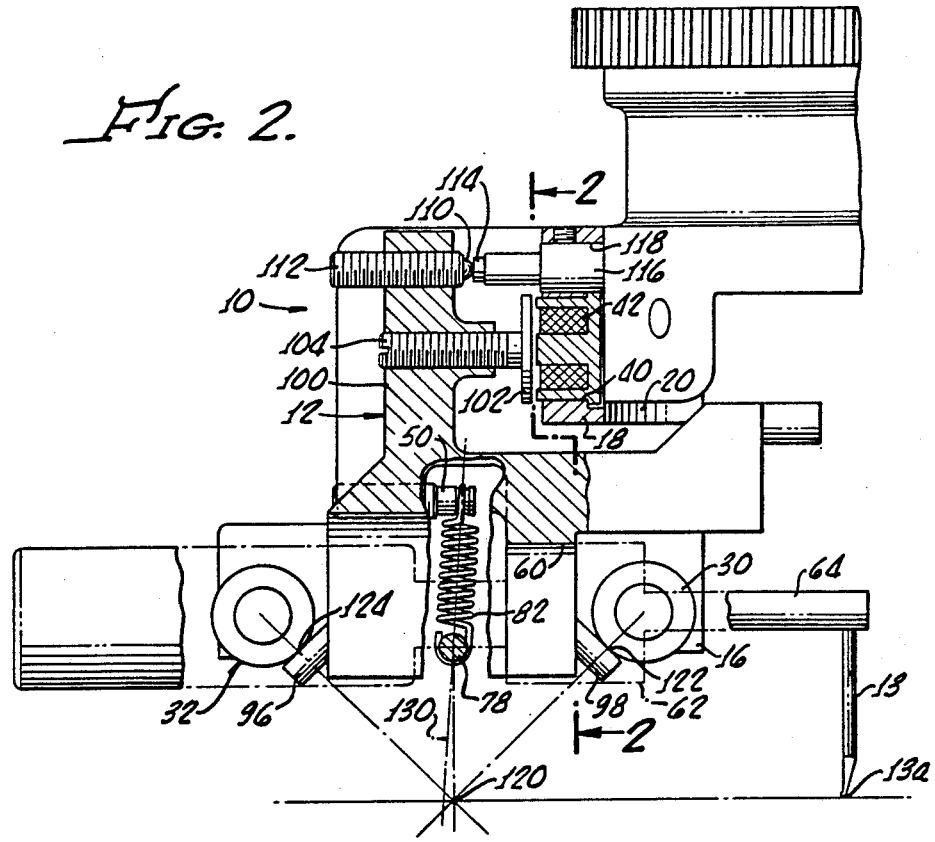
FIG. 2 is a side elevational view (with parts broken away)R of parts of the machine of FIG. 1.
FIG. 4 is a plan view of the bottom of the arrangement of FIG. 2.

Secured in a hole 40 that is formed in the arcuate surface 20 and extends through bight 18, is an electromagnet 42 (FIG. 2).

Side legs 14,16 are formed with a vertically extending, downwardly opening recesses 44,46 at the upper end of which are fixedly mounted spring holding frame screws 48,50 which are cantilevered to project longitudinally of the frame into the respective recesses but not completely across the recesses.

The transducer support, as pictorially illustrated in FIG. 6, comprises a rigid yoke 52 having side legs 54 and 56 laterally spaced apart to provide a downwardly opening and longitudinally extending arcuate bore 60 (FIG. 3) which receives the cylindrical body 62 of an ultrasonic transducer having a forwardly extending longitudinal arm 64 to which is secured the bonder tool 13, projecting substantially vertically downwardly from the arm 64. The tool has a tool tip 13a formed with a downwardly opening wire receiving groove (not shown). Transducer 62 is secured in the arcuate bore 60 of the yoke by means of a pair of screws 66,68 which are employed to forcibly close a pair of inwardly opening slits 70,74 (FIG. 3) formed in the inner surfaces of the bore 60 to thereby clamp the transducer to the yoke.

Extending transversely outwardly from substantially central portions of the lower ends of the yoke legs 54,56 are cantilevered spring holding yoke screws 76,78. Tension springs 80,82 are secured at their lower ends to the screws 76,78 and at their upper ends to the frame screws 48,50.

First and second longitudinally extending rigid circular cylindrical follower rods 90,92 are fixedly secured, as by being a press fit for example, in front and back ends of yoke side leg 54 and extend downwardly and outwardly from the yoke leg into contact with surfaces of rollers 22,24 that are below and inwardly of the roller axes. Similarly, a pair of longitudinally extending rigid circular cylindrical follower rods 96,98 is fixed to the forward and rearward ends of yoke leg 56 extending downwardly from the yoke leg and contacting portions of the outer surface of rollers 30,32 that are below and inwardly of the roller axes. As previously mentioned, roller 32 is a double coaxial roller, comprising coaxial roller sections 32a and 32b, which are slightly spaced apart axially to receive the rigid follower pin 96 there between. This pin contacts the spaced adjacent edges of the two rollers, thereby providing for relatively fixed lateral positioning of the frame with respect to the yoke.

The upper intermediate section of yoke 52 carries an upstanding post 100 to which is mounted a disc 102 of magnetic material having a face positioned closely adjacent to but slightly spaced from the face of the electromagnet 42 on the frame. Longitudinal position of the disc 102, relative to the magnet 42, is adjustable by means of a screw 104, integral with disc 102, threaded in post 100 and connected to the disc 102.

An electrical contact 110 (FIG. 5) carried on an arm 112 that is adjustably threaded in the yoke post 100, cooperates with a second contact 114 carried in a sleeve 116 fixed in a hole 118 of the bight 18 to provide both a physical stop for limiting motion of the upper portion of the yoke toward the frame (toward the right, as viewed in FIG. 2) and an electrical sensor to signal touchdown of the tip 13a on the workpiece. Touchdown is signaled by a response to the counter clockwise (as viewed in FIG. 2) motion of the yoke that occurs upon touchdown, which motion separates the normally contacting electrical contact elements 110 and 114. This touchdown signal is not part of the precision vertical positioning and force control system (to be described below) of the present invention. Nevertheless, it may be used to provide a rough check on operations of the vertical position control servo. But it need not be used at all.

Yoke 52 and all parts (including tool 13) are effectively pivotally carried in the bonder frame 10 by means of springs 80,82 rollers 22,24,30 and rods 90,92,96,98.

An important part of the force controlling or precise positioning servo of the present invention is a position sensor that generates a signal proportional to or otherwise indicative of vertical (Z axis) position of the tool 13 (actually transducer support 12) relative to the frame 10. Many types of position sensors may be employed. However, it is found convenient to use an optical sensor of the type shown in U.S. Pat. No. 4,718,591 of William Hill, identified above. Thus, in this exemplary embodiment the position sensor takes the form of a conventional optical sensor assembly 119, fixedly mounted on frame 10, (FIGS. 3 and 5). Assembly 119 carries a light emitting diode (not shown) and a photo detector (not shown) for detecting location of the forward vertical edge of post 100 of transducer support 12. The optical field of view of the sensor assembly normally includes a forward portion of post 100 and the forward (toward the right as viewed in FIGS. 2 and 5) edge of the post.

Light emitted by the sensor is reflected from a forward portion of the post for reception by the sensor photodetector. The portion of the post 100 that is illuminated by the sensor increases as the post 100 moves to its forward limit position. Upon downward motion of the bonding frame support, which causes contact of the tool tip with the workpiece (e.g. touchdown), the yoke 52 pivots counter clockwise (as viewed in FIG. 2) and post 100 moves toward the left relative to the frame 10 and relative to the optical sensor assembly 119, thereby decreasing magnitude of the output signal of the sensor. This signal is proportional to the amount of light reflected from post 100 and received by the sensor photodetector. Therefore, the photodetector provides a signal having a magnitude proportional to displacement of the post 100 (and tool 13) relative to the bonder frame. This signal is used as a position feedback signal in the force servo of the present invention.

This sensor structure is present in the bonder described in the above-identified U.S. Pat. No. 4,718,591 of William Hill, but is employed therein only to signal attainment of a preselected amount of over travel. Upon occurrence of such over travel in the apparatus of U.S. Pat. No. 4,718,591, vertical motion of the bonder frame is stopped and the frame is held, unmoving, in this position during the bonding operation. There is no further operation of vertical drive motor 17. In the prior Hill patent, this sensor is not part of any servo, and is not used for closed loop control of force applied to the wire by the bonding tool.

The apparatus is nominally set up so that a virtual center of motion 120 (FIG. 2) lies in a plane parallel to a line containing the axes 26,28 of the rollers 22,24 and containing the tip 13a of tool 13. The virtual center 120 is equidistant from the axes 26,28 and lies on a vertical line containing the center of gravity of the yoke. The longitudinal axes of follower rods 90,92 are perpendicular to the respective radii of the rollers at the points of tangential contact 122,124 between the follower rods and the respective roller surfaces. The roller radii through the tangential contact points meet at the center of motion 120. The rollers and rod followers are symmetrically disposed on either side of a plane extending parallel to the roller axes and bisecting and perpendicular to the line between the axes.

Assuming the axes of springs 80,82 are vertical, as viewed in FIG. 2 (they may be tilted if desired) and equidistant from the roller axes 26,28, the yoke will be urged upwardly by the springs so that the points of contact between the follower rods and the rollers are equidistant between the intersections of the roller surfaces with a line joining the axes 26,28 and the intersection of the roller surface with a vertical line extending downwardly from the roller axes. In other words, the tangent points are half way between intersections of horizontal and vertical diameters of the rollers. The upward forces on the yoke, exerted by the nominally vertically directed spring axes, are balanced by vertically downward components of force exerted by the rollers on their respective follower pins at the respective tangent points.

The rollers, being substantially frictionless, can exert on the follower rods only forces directed radially of the rollers at the tangent points. Horizontal components of these forces are equal and opposite, and thus the springs hold the rollers in a position of fore-and-aft equilibrium from which the yoke may be displaced about the virtual center 120 by a motion that moves each follower rod along the surface of the roller. Stated otherwise, such motion effectively causes the rods to roll along the roller surfaces. Thus, for example, if the yoke moves toward the right, as illustrated in FIG. 2, the forward rod 96 moves along the surface of roller 30 downwardly and toward the right while the rod 98 moves along the surface of its rollers 32a and 32b upwardly and toward the right. The net effect of this motion about the virtual center 120 is a substantially linear vertical motion of the tip 13a of the tool 13 upon touchdown.

Although the yoke as a whole is effectively pivoted to the frame, there is a negligibly small horizontal motion of the tool tip within reasonably small ranges of relative vertical motion of the yoke and frame. Thus tip skid is negligible, even though tool displacement relative to the yoke is relatively large.

Screws 48,50 are adjustable threaded in the frame sides 14,16 so as to enable adjustable variation of the point to which the upper ends of each of the springs is attached. This provides a downward bias of the tool tip for tool force preload, if this is necessary or desirable. The upper end of each spring may be moved forwardly or rearwardly by adjustment of the screws 48,50 to thereby achieve a vertical inclination of the spring axes. Thus, as illustrated in FIG. 2, the screws 48,50 are positioned within the frame so that the upper portions of springs 80 and 82 are positioned sufficiently to the right of a vertical line through the virtual center 120 that the spring axes lie along lines indicated at 130. With this inclination of the spring axes, the yoke has a nominal position of equilibrium in which the tool tip 13a is displaced linearly downwardly below the position which it would assume if the spring axes were vertical. However, motion toward this nominal equilibrium position, in which the tool tip 13a is below the position illustrated in FIG. 2, is restrained by abutment of the contact elements 110,114 which serve to physically limit the clockwise position to that shown in FIG. 2.

Although one particular compliant mounting of the bond tool to its vertically driven carriage has been described in detail, it is contemplated that other types of compliant mounting of the bond tool may be employed with use of the force servo to be described below. For example, the tool may be mounted to its carriage with a small amount of resiliently restrained linear motion in a vertical direction, relative to its carriage.

SERVO CONTROLLED MOTION

Figure 7:
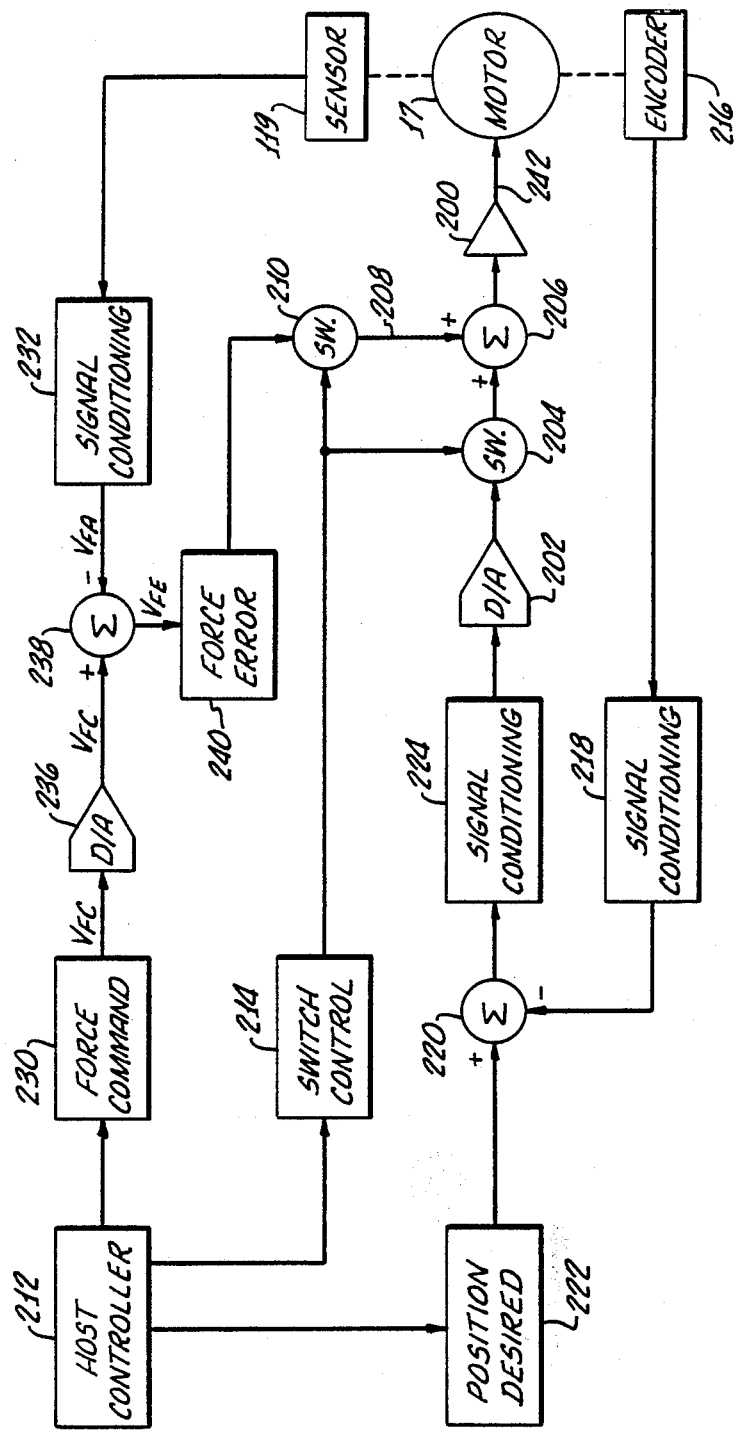
FIG. 7 is a block diagram of the dual servo for driving the carriage.

In operation, the bonding tool is driven downwardly to a predetermined target search position by a substantially conventional position loop servo illustrated in FIG. 7. In target search position, the tool tip is at a nominal distance above the upper surface of a bond pad of chip 19. Such a distance is normally set to about 5 to 10 mils and, in actual practice, may vary from between 2 and 13 mils depending on the amount that the top of the bond pad departs from its nominal height. The position loop servo includes the Z axis motor 17 (FIG. 1) which is driven from a motor amplifier 200, which in turn receives the output of a digital to analog convertor 202 via a first switch 204 and a junction circuit 206.

Circuit 206 has a second input on a line 208 from a second switch 210 which is in open (off) position during the position loop servo operation which drives the bonding frame to target search height. During this operation switch 204 is closed (on). Circuit 206 will simply transmit either one of its inputs. For the position loop target search height positioning, the motor employs a motor position feedback in the form of an incremental encoder 216 that provides a feedback signal via a feedback conditioning circuit 218 to one input of a difference or error circuit 220 of the position loop position servo. A second input to the difference circuit 220 is the commanded or desired position (target search position) provided from a host controller 212 via a desired position circuit 222. The position error signal from circuit 220 is fed through a digital filter and signal conditioning circuit 224 (preferably the encoder signal and the desired position signal are digital) which provides the input to the digital to analog convertor 202. The latter provides its analog output, representing position error, via the closed switch 204 and circuit 206 to the motor amplifier 200 which drives motor 17.

The desired position that is set into the position servo from the host controller is established at a value which will cause the Z axis drive to move the carriage 15, together with all of the bonder parts carried thereby, downwardly until the tool tip 13a is at some predetermined distance (in the order of 2 to 13 mils for example, as mentioned above) above the nominal surface of a bonding pad on a chip 19 or on another surface to which a bond is to be made. By selecting a target search height position that is above the maximum height of the chip (bond pad) surface, the system, under control of the position loop positioning servo, will always cause the tool tip to stop at a height close to but spaced above the surface of the chip or other object to which the bond is to be made. Although a target search height at a position spaced from the surface of the object is preferred, the invention can also be operated if the target search height is set intentionally or inadvertently at a height which will cause contact between the tool tip and the object and which, therefore, will cause some small amount of tool tip deflection on its resilient mounting with respect to the bond frame.

Having precisely located the tool tip at its target search height, the position loop position servo is disabled by any suitable means, such as, for example, opening switch 204 in response to a switching signal received from the host controller 212 via a switch control 214. Closed loop force servo operation is initiated upon disabling the position servo. The force servo is activated by closing switch 210 in response to a switching signal received via switch control 214 from the host controller. Opening of switch 204 and closing of switch 210 may occur simultaneously.

Now the carriage drive motor 17, previously controlled only by the position loop position servo, is controlled only by the closed loop force servo. The force servo operates the vertical drive motor 17 in accordance with the difference between tool tip position relative to the tool carriage or frame 10 and a commanded force provided from the host controller via a commanded force circuit 230. A position feedback signal, produced by the optical tool position sensor assembly 119, is fed back via a feedback signal conditioning circuit 232 which effectively transforms the electrical signal from the optical sensor 119 into a voltage that may be compared with the voltage of a commanded force signal from circuit 230. Feedback conditioning circuit 230 provides the actual force feedback signal $V_{FA}$ according to the equation $V_{FA}=KV_x$, where $V_x$ is a voltage proportional to displacement sensed by sensor 119 and K is the spring constant of the tool mounting springs. A digital commanded force signal $V_{FC}$ from circuit 230 is fed through a digital to analog convertor 236 from the output of which the commanded signal is fed to a servo error or difference circuit 238 for comparison with the actual force feedback signal $V_{FA}$. The output of the difference circuit 238 is the force error signal $V_{FE}$ which is fed via a conditioning circuit 240, via closed switch 210 and via circuit 206 to motor 17.

In the operation of the closed loop force servo, the first input to circuit 206 from switch 204 (now open or off) is absent. Thus the circuit 206 will provide the output signal $V_{FE}$ as the input to motor amplifier 200. This output signal is proportional to the difference between the commanded force signal $V_{FC}$ and the feedback position (actual force) signal $V_{FA}$. Effectively the force servo operates to apply the full amount of the commanded force signal $V_{FC}$ to the motor, except as such signal is diminished by the magnitude of the actual force feedback signal $V_{FA}$. Thus before touch down, when the tool tip is at target search height, but is not yet in contact with the chip bonding pad, the feedback signal is at some minimum value. At this time the force error signal from the output of the difference circuit 238 has a maximum value and the motor 17 is energized to drive the bonding tool downwardly toward the workpiece. As the tool tip contacts the workpiece, downward travel continues. This causes the tool to be displaced upwardly relative to its drive carriage, and the feedback signal from the optical sensor 119 begins to diminish (e.g. its negative value increases so as to decrease force error signal).

As the tool tip displacement increases, the force error signal from difference circuit 238 decreases and the motor continues to drive the bonder tool frame downwardly until the feedback signal becomes effectively equal and opposite to the commanded force signal. At this time the force error signal is substantially zero and motor drive stops with the tool tip displaced relative to the bonder frame by an amount that causes the tool tip to exert upon the workpiece a force that is determined by the magnitude of the commanded force signal of circuit 230.

When the error signal from circuit 238 is at or close to zero, the bonding operation may be initiated. This may be done automatically (as by electronically observing the output of encoder 216), or by automatically sensing occurrence of substantially zero error signal and automatically initiating ultrasonic vibration (since adequate bonding pressure has now been attained), or this may be done manually by observing a display initiated by occurrence of the zero pressure or force error signal from difference circuit 238. In any event, application of the ultrasonic bond energy may begin very shortly after touchdown. However, vertical motion has only nominally stopped because of vibration and other factors described above.

Even though appropriate and precisely controlled force has been attained and bonding operation may be initiated, the conditions described above (that cause force variation during the bonding operation), namely touch sensitivity, wire deformation, die (chip) placement height and mechanical vibration, may effectively modify the force applied by the tool by causing the tool tip (which remains in contact with the wire being bonded throughout the bonding) to change its elevation. Because the tool tip is urged downwardly by the springs 80,82, a change in displacement of the tool tip, that is, a change in its vertical position, while the carriage remains stationary, will change the deflection of the springs and thereby change the force exerted by the springs (since the spring force is proportional to spring deflection). Therefore, change in vertical elevation of the tool tip caused by mechanical vibration, wire deformation or the like, tends to cause a variation in the applied pressure during the bonding operation. However, the described force servo acts to avoid or minimize any such change in applied force by effectively maintaining the bonding tool tip at a fixed vertical position relative to its carriage. This minimizes any change in spring deflection.

For example, a vibratory force, at any given instant in the vibration cycle, may tend to raise the workpiece and the tool tip in contact with the workpiece, thereby increasing displacement of the springs and increasing applied force. The resulting upward displacement of the tool relative to the frame causes the feedback signal to change and thereby to provide a change in the error signal from error circuit 238 so that the carriage is driven upwardly. Polarities of the signals fed to the error circuit 238 are controlled such that the force servo operation actually causes the carriage to follow motion of the workpiece so that if the workpiece goes up because of a vibration during a bonding, the serving action will cause the carriage to go up and thereby not result in any increased spring deflection. Similarly, if the workpiece should move downwardly, as when the wire flattens during bonding, the carriage is driven further downwardly, again minimizing change in spring deflection. These motions are of very small magnitude.

From another point of view, the described force servo operates to rapidly sense any change of position of the tool relative to the slide and bonding frame 10 and to provide a compensatory increment of motor drive that will cause the bonding frame to effectively rise or fall together with the rise or fall of the workpiece. If the bonding frame rises together with the workpiece, no increase in displacement of the bonder tool tip relative to the frame is needed to maintain contact, and thus the spring displacement remains the same, as does the applied force. In other words, should the workpiece tend to rise, the feedback signal exceeds the force command signal and the bonding frame is driven upwardly until the two signals into difference circuit 238 are again equal. On the other hand, should the workpiece surface fall, the tool tip tends to fall with the surface, thereby decreasing the feedback signal so that the error signal becomes a net downward drive signal to again cause the carriage to follow the motion of the workpiece and minimize change in displacement of the tool relative to the carriage. Further, the tool will follow, with constant force, the wire deformation which occurs as the wire is flattened during the making of a bond. Effectively then the described force servo will slave the carriage vertical position to the vertical height of the work surface. Since vibrations of the work surface are generally in the order of 10 to 15 cycles per second, the described servo loop will readily and closely follow such vibrations and thus cause the carriage to follow variations in height of the workpiece during the actual bonding operation, thus minimizing variation in applied force.

Use of the described force servo enables more precise control of vertical position of the bonder tool. Therefore this servo will allow a much simplified mounting of the tool to the carriage and may eliminate the need for the flexural and open center mountings of U.S. Pat. Nos. 4,598,853 and 4,718,591.

What is claimed is:

1. A method of contacting an object by a tool with a predetermined force comprising:

compliantly mounting a tool to a carriage for motion of the tool relative to the carriage in a first direction, resisting relative motion of the tool and carriage in said direction, generating a force command signal, generating a feedback signal indicative of position of said tool with respect to said carriage, and moving the carriage relative to the object in response to the feedback signal so as to decrease the difference between said force command signal and said feedback signal.

2. The method of claim 1 wherein said step of resisting comprises applying to said tool a motion resisting force having a magnitude that varies with motion of the tool relative to the carriage.

3. The method of claim 1 including the step of employing a position servo to drive the carriage toward the object to move the tool to a search position adjacent the object, and wherein said step of moving the carriage comprises employing said force command signal and said feedback signal in a force servo to produce a force error signal in said force servo, and employing the force servo to move the carriage in a sense to decrease the force error signal.

4. The method of claim 3 including the steps of initially disabling the force servo and operating the position servo until the tool is in said search position, and then enabling the force servo and disabling the position servo to maintain a substantially constant force between said tool and object.

5. Force applying apparatus comprising:

a carriage movable in a first direction, a tool mounted to the carriage for relative motion in said direction, means for resisting said relative motion, drive means for moving said carriage toward an object to which a force is to be applied by said tool, thereby moving said tool into contact with said object and causing said tool to move relative to said carriage, command means for generating a force signal indicative of a force to be applied to the object by the tool, sensor means for generating a feedback signal indicative of position of said tool relative to said carriage, and force control means responsive to said feedback and force signals for applying to said drive means a force error signal indicative of the difference between said force signal and said feedback signal.

6. The apparatus of claim 5 wherein said drive means comprises a carriage drive motor, and including positioning means for actuating the motor to move the tool to a search position adjacent the object, said force control means comprising a force servo responsive to said command means and including said sensor means for generating said force error signal, and means for applying the force error signal to the carriage drive motor so as to drive the carriage in a sense to decrease said force error signal, whereby said carriage is maintained at a position in which said force signal tends to be equal to said feedback signal.

7. The apparatus of claim 5 wherein said tool comprises an ultrasonic wire bonding tip effectively pivoted to said carriage, and wherein said means for resisting comprises at least one spring connected to and between said tool and carriage.

8. The apparatus of claim 7 including means for disabling said force servo until said tool is in said search position, and means for disabling said positioning means and enabling said force servo after said tool is in said search position.

9. An ultrasonic wire bonder comprising:

a support, a work table connected to the support for carrying an object to which a wire is to be bonded, a bonder frame, means for mounting the frame to the support for motion in a first direction, a transducer support a transducer carried on said support, a bonder tool connected to the transducer, means for mounting the transducer support to the bonder frame for motion relative to the bonder frame in said direction, spring means for resisting said motion of the transducer support relative to the bonder frame, sensor means for generating a tool position signal indicative of position of the bonder tool relative to the bonder frame, motor means for moving the bonder frame relative to the support toward and away from an object carried on the worktable, force command means for generating a force command signal, and force control means responsive to said force command signal and to said tool position signal for energizing the motor means and moving the bonder frame so as to decrease the difference between said force command signal and said tool position signal.

10. The wire bonder of claim 9 including position control means for energizing the motor means to cause the bonder tool to move to a search position adjacent an object carried by the worktable, means for disabling said force control means and initiating operation of said position control means until the tool attains said search position, and means for disabling said position control means and initiating operation of said force control means when the tool attains the search position.

11. The bonder of claim 10 wherein said means for mounting the transducer support to the bonder frame comprises mounting means including said spring means for mounting the transducer support to the bonder frame for motion of said bonder tool about a center of motion displaced from said transducer support and frame, said sensor means comprising optical means having transmitting and receiving parts on said bonder frame.

12. The bonder of claim 10 wherein said means for mounting the transducer support to the bonder frame comprises means, including said spring means, for effectively pivotally connecting the transducer support to the bonder frame, said sensor means comprising optical means on said bonder frame for sending light energy to the transducer support and for receiving light energy reflected therefrom.

13. In an ultrasonic wire bonder wherein a bonding tool is mounted to a transducer support frame for motion relative to the frame and is resiliently restrained against such motion, wherein the transducer support frame is mounted for motion toward and away from a workpiece under control of a drive motor, and wherein the point of contact of the tool on the wire is subject to displacement toward or away from the frame, apparatus for providing a substantially constant force between the bonding tool and wire to be bonded, said apparatus comprising:

servo means for maintaining a predetermined position of said transducer support frame relative to the object, said servo means comprising means for actuating the drive motor to cause the frame to follow motion of said point of contact, said means for actuating comprising:

means for sensing position of said bonding tool relative to said transducer support frame and generating a feedback signal, means for generating a force command signal, and means responsive to the difference between said feedback signal and said force command signal for driving said motor in a sense to decrease said difference.

14. A method of contacting an object by a tool with a predetermined force comprising:

mounting a tool to a carriage for motion of the tool relative to the carriage in a first direction, resiliently resisting relative motion of the tool and carriage in said direction, and maintaining a constant force between the object and tool by a closed loop servo that causes the carriage to follow displacement of the object relative to the carriage to thereby maintain the tool in fixed position relative to the carriage, said step of maintaining comprising:

generating a force command signal, generating a feedback signal indicative of position of said tool with respect to said carriage, and moving the carriage relative to the object so as to decrease the difference between said force command signal and said feedback signal.

* * * * *